(12) United States Patent
Marino et al.

(10) Patent No.: US 10,840,387 B2
(45) Date of Patent: Nov. 17, 2020

(54) BURIED OXIDE TRANSCAP DEVICES

(71) Applicant: QUALCOMM Incorporated, San Diego, CA (US)

(72) Inventors: Fabio Alessio Marino, San Marcos, CA (US); Sinan Goktepeli, San Diego, CA (US); Narasimhulu Kanike, San Diego, CA (US); Qingqing Liang, San Diego, CA (US); Paolo Menegoli, San Jose, CA (US); Francesco Carobolante, Carlsbad, CA (US); Aristotele Hadjichristos, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/946,628

(22) Filed: Apr. 5, 2018

(65) Prior Publication Data

US 2019/0312152 A1 Oct. 10, 2019

(51) Int. Cl.
*H01L 29/93* (2006.01)
*H01L 29/36* (2006.01)
*H01L 27/12* (2006.01)

(52) U.S. Cl.
CPC .......... *H01L 29/93* (2013.01); *H01L 27/1203* (2013.01); *H01L 29/36* (2013.01)

(58) Field of Classification Search
CPC ....................................................... H01L 29/93

USPC ......................................................... 257/312
See application file for complete search history.

(56) References Cited

U.S. PATENT DOCUMENTS

| 8,803,288 | B1 | 8/2014 | Marino et al. | |
| 2006/0043454 | A1* | 3/2006 | Coolbaugh | H01L 29/93 257/312 |
| 2010/0252880 | A1* | 10/2010 | Stribley | H01L 21/266 257/335 |
| 2012/0281336 | A1* | 11/2012 | Marino | H01G 7/00 361/281 |
| 2014/0367832 | A1* | 12/2014 | Marino | H01L 29/0615 257/597 |
| 2015/0194538 | A1 | 7/2015 | Marino et al. | |

* cited by examiner

*Primary Examiner* — Hsin Yi Hsieh
(74) *Attorney, Agent, or Firm* — Patterson & Sheridan, LLP

(57) ABSTRACT

Certain aspects of the present disclosure provide semiconductor variable capacitors. One example semiconductor variable capacitor generally includes a semiconductor region, a first insulator region disposed below the semiconductor region, a first non-insulative region disposed below the first insulator region, a second non-insulative region disposed adjacent to the semiconductor region, and a third non-insulative region disposed adjacent to the semiconductor region, wherein the semiconductor region is disposed between the second non-insulative region and the third non-insulative region. In certain aspects, the semiconductor variable capacitor may include a second insulator region disposed above the semiconductor region and a second semiconductor region disposed above the second insulator region.

5 Claims, 11 Drawing Sheets

BURIED OXIDE TRANSCAP DEVICES

TECHNICAL FIELD

Certain aspects of the present disclosure generally relate to electronic circuits and, more particularly, to a variable semiconductor capacitor.

BACKGROUND

Semiconductor capacitors are fundamental components for integrated circuits. A variable capacitor is a capacitor whose capacitance may be intentionally and repeatedly changed under the influence of a bias voltage. A variable capacitor, which may be referred to as a varactor, is often used in inductor-capacitor (LC) circuits to set the resonance frequency of an oscillator, or as a variable reactance, e.g., for impedance matching in antenna tuners.

A voltage-controlled oscillator (VCO) is an example circuit that may use a varactor in which the thickness of a depletion region formed in a p-n junction diode is varied by changing a bias voltage to alter the junction capacitance. Any junction diode exhibits this effect (including p-n junctions in transistors), but devices used as variable capacitance diodes are designed with a large junction area and a doping profile specifically chosen to improve the device performance, such as quality factor and tuning range.

SUMMARY

Certain aspects of the present disclosure provide a semiconductor variable capacitor. The semiconductor variable capacitor generally includes a first semiconductor region. The semiconductor variable capacitor further includes a first insulator region disposed below the semiconductor region. The semiconductor variable capacitor further includes a first non-insulative region disposed below the first insulator region. The semiconductor variable capacitor further includes a second non-insulative region disposed adjacent to the semiconductor region. The semiconductor variable capacitor further includes a third non-insulative region disposed adjacent to the semiconductor region. The semiconductor region is disposed between the second non-insulative region and the third non-insulative region. The second and third non-insulative regions have different doping types. The semiconductor variable capacitor further includes a second insulator region disposed above the semiconductor region. The semiconductor variable capacitor further includes a second semiconductor region disposed above the second insulator region.

Certain aspects of the present disclosure provide a semiconductor variable capacitor. The semiconductor variable capacitor generally includes a semiconductor region. The semiconductor variable capacitor further includes a first insulator region disposed below the semiconductor region. The semiconductor variable capacitor further includes a first non-insulative region disposed below the first insulator region. The semiconductor variable capacitor further includes a second non-insulative region disposed adjacent to the semiconductor region. The semiconductor variable capacitor further includes a third non-insulative region disposed adjacent to the semiconductor region. The semiconductor region is disposed between the second non-insulative region and the third non-insulative region. The second and third non-insulative regions have different doping types. The semiconductor variable capacitor further includes a fourth non-insulative region disposed above at least a portion of the semiconductor region and above at least a portion of the second non-insulative region or the third non-insulative region.

Certain aspects of the present disclosure provide a semiconductor variable capacitor. The semiconductor variable capacitor generally includes a semiconductor region. The semiconductor variable capacitor further includes a first insulator region disposed below the semiconductor region. The semiconductor variable capacitor further includes a first non-insulative region disposed below the first insulator region. The semiconductor variable capacitor further includes a second non-insulative region disposed adjacent to the semiconductor region. The semiconductor variable capacitor further includes a third non-insulative region disposed adjacent to the semiconductor region. The semiconductor region is disposed between the second non-insulative region and the third non-insulative region. At least one top length of the semiconductor region is less than a bottom length of the semiconductor region.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure are generally directed to a semiconductor variable capacitor structure with reduced interface charge traps.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Figure 1:
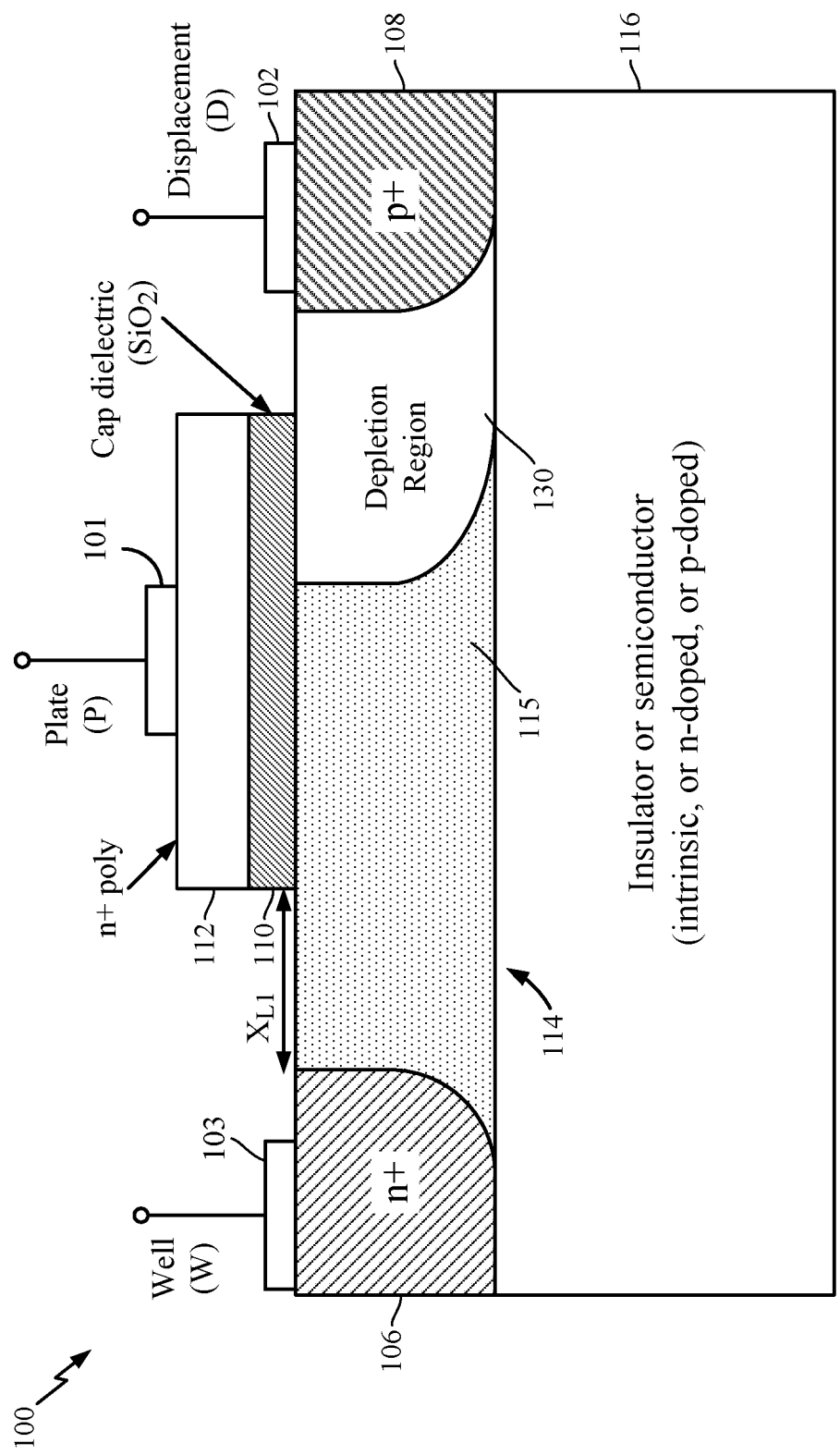
FIG. 1 illustrates an example semiconductor variable capacitor.

FIG. 1 illustrates an example structure of a transcap device 100, in accordance with certain aspects of the present disclosure. The transcap device 100 includes a non-insulative region 112 coupled to a plate (P) terminal 101, a non-insulative region 106 coupled to a well (W) terminal 103, and a non-insulative region 108 coupled to a displacement (D) terminal 102. Certain implementations of a transcap device use a plate oxide layer 110 disposed above a semiconductor region 114. The plate oxide layer 110 may isolate the W and P terminals, and thus, in effect act as a dielectric for the transcap device 100. The non-insulative region 106 (e.g., heavily n doped region) and the non-insulative region 108 (e.g., heavily p doped region) may be formed in the semiconductor region 114 and on two sides of the transcap device 100 in order to create p-n junctions. As used herein, a non-insulative region generally refers to a region that may be conductive or semiconductive.

In certain aspects, a bias voltage may be applied between the D terminal 102 and the W terminal 103 in order to modulate the capacitance between the P and W terminals. For example, by applying a bias voltage to the D terminal 102, a depletion region 130 may be formed between the p-n junction of the non-insulative region 108 and the region 115 of the semiconductor region 114. Based on the bias voltage, this depletion region 130 may widen under the plate oxide layer 110, reducing the area of the equivalent electrode formed by the semiconductor region 114, and with it, the effective capacitance area and capacitance value of the transcap device 100. Furthermore, the bias of the W and P terminals may be set as to avoid the formation of an inverted region underneath the oxide and operate the transcap device 100 in deep depletion mode. By varying the voltage of the W terminal with respect to the P and D terminals, both vertical and horizontal depletion regions may be used to modulate the capacitance between the W and P terminals.

The work-function of the non-insulative region 112 above the plate oxide layer 110 may be chosen to improve the device performance. For example, an n-doped poly-silicon material may be used (instead of p-doped), even if the semiconductor region 114 underneath the plate oxide layer 110 is doped with n-type impurities. In some aspects, a metallic material (also doped if desired) may be used for the non-insulative region 112 with an opportune work-function or a multi-layer stack of different metallic materials to obtain the desired work-function. In certain aspects, the non-insulative region 112 may be divided into two sub-regions, one n-doped and one p-doped, or a different metallic material may be used for each sub-region.

In some cases, the semiconductor region 114 may be disposed above an insulator or semiconductor region 116. The type of material for the region 116 may be chosen in order to improve the transcap device 100 performance. For example, the region 116 may be an insulator, a semi-insulator, or an intrinsic/near-intrinsic semiconductor in order to decrease the parasitic capacitances associated with the transcap device 100. In some cases, the region 116 may be made of n-doped or p-doped semiconductor with an appropriate doping profile in order to increase the transcap device Q and/or the control on the depletion region 130 that may be formed between the non-insulative region 108 and the region 115 of the semiconductor region 114 when applying a bias voltage to the D terminal 102. The region 116 may also be formed by multiple semiconductor layers or regions doped in different ways (n, p, or intrinsic). Furthermore, the region 116 may include semiconductors, insulating layers, and/or substrates or may be formed above semiconductors, insulating layers, and/or substrates.

To better understand the working principle of the transcap device 100, it may be assumed that the D terminal 102 is biased with a negative voltage with respect to the W terminal 103. The width of the depletion region 130 in the semiconductor region 114 may be controlled by applying a control voltage to the D terminal 102 or to the W terminal 103. The capacitance between the W and P terminals may depend on the width of the depletion region 130 in the semiconductor region 114, and thus, may be controlled by applying the control voltage to the D terminal 102. Furthermore, the variation of the bias voltage applied to the D terminal 102 may not alter the direct-current (DC) voltage between the W and P terminals, allowing for improved control of the device characteristics.

In some cases, it may be preferable to have the non-insulative region 106 and/or non-insulative region 108 a distance away from the plate oxide layer 110 in order to reduce the parasitic capacitance associated with the non-insulative region 108 and improve the isolation of the non-insulative region 106 for high control voltages. For example, the non-insulative region 106 may be partially overlapped with the plate oxide layer 110, or the non-insulative region 106 may be formed at a distance from the edge of the plate oxide layer 110 to increase the device tuning range and linearity. In the latter case, the voltage-withstanding capability of the device is improved since a portion of a radio-frequency (RF) signal, that may be applied to the P and W terminals, drops between the oxide edge and the non-insulative region 106 instead of being applied entirely across the plate oxide layer 110. The non-insulative region 108 may be partially overlapped with the plate oxide layer 110, or the non-insulative region 108 may be spaced apart from the plate oxide layer 110 so as to reduce the parasitic capacitance between the P terminal 101 and the D terminal 102.

In certain aspects, the semiconductor region 114 may be implemented with a p-well region to improve the breakdown voltage of the p-n junction between the non-insulative region 108 and the region 115 of the semiconductor region 114, decreasing, at the same time, the parasitic capacitance between the P terminal 101 and the D terminal 102, as described in more detail herein. Similarly, the semiconductor region 114 may be implemented with an n-doped region between the non-insulative region 106 and region 115 of the semiconductor region 114 in order to regulate the doping concentration between the plate oxide layer 110 and the non-insulative region 106, as described in more detail herein. A junction between the two or more regions may be disposed below the plate oxide layer 110 to improve the Q of the transcap device 100.

Figure 2:
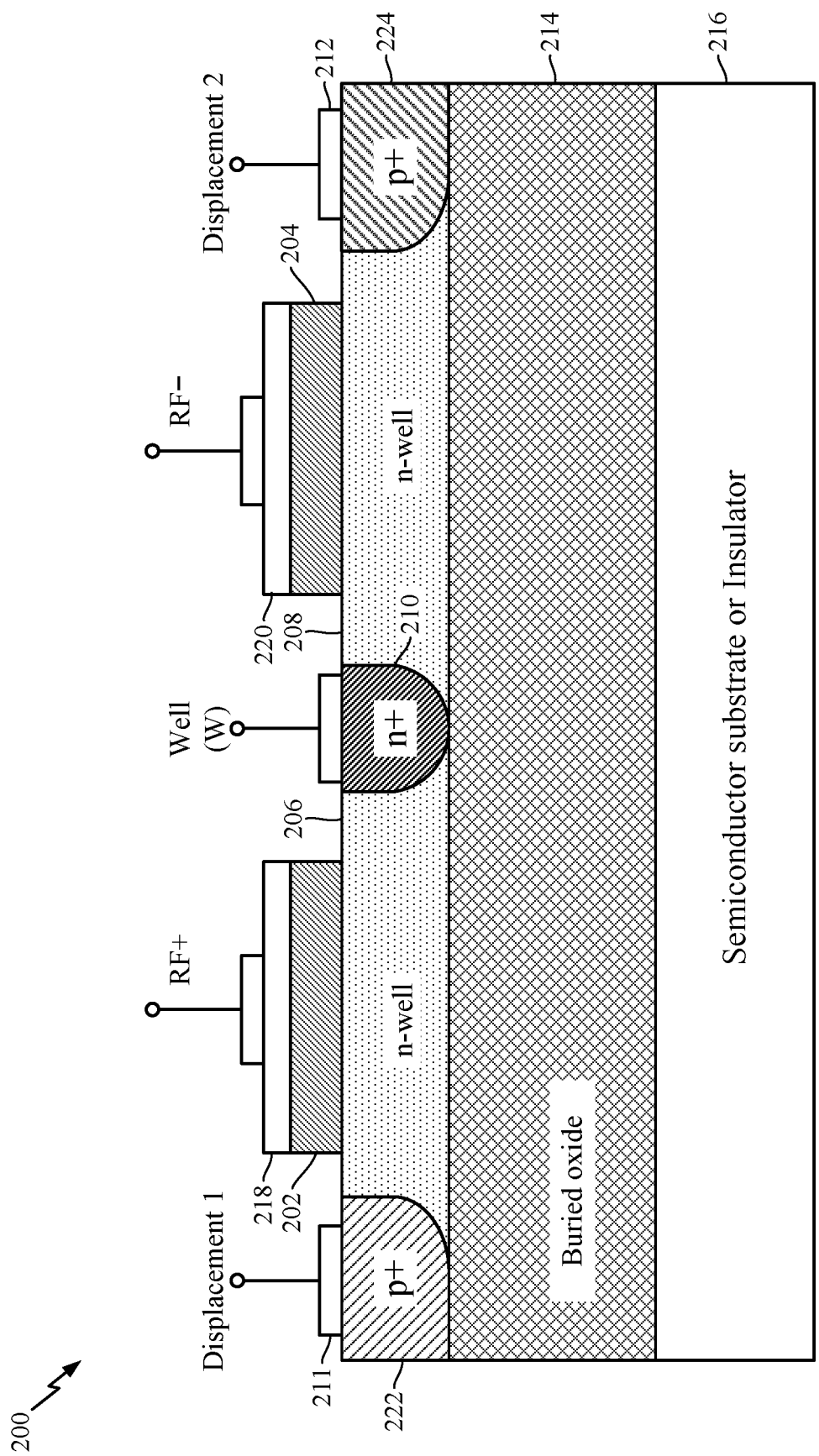
FIG. 2 illustrates an example differential semiconductor variable capacitor.

FIG. 2 illustrates an example differential transcap device 200. The differential transcap device 200 may be obtained by disposing two of the transcap devices 100 back-to-back. In this example, RF+ and RF− terminals (e.g., corresponding to the P terminal in FIG. 1) correspond to the positive and negative nodes of a differential RF port for a differential RF signal. The RF+ terminal may be coupled to a non-insulative region 218, and the RF− terminal may be coupled to a non-insulative region 220, each of the non-insulative regions 218 and 220 disposed above respective oxide layers 202 and 204. N-well regions 206 and 208 may be coupled to a W terminal via a non-insulative region 210 (e.g., n+), as illustrated. The differential transcap device 200 also includes D terminals 211 and 212 coupled to respective non-insulative regions 222 and 224. A bias voltage may be applied to the D terminals 211 and 212 (or to the W terminal with respect to the other terminals of the device) to adjust a depletion region of the n-well regions 206 and 208, respectively, thereby adjusting the capacitance between respective RF+ and RF− terminals and the W terminal. In some aspects, a buried oxide layer 214 may be positioned below the n-well regions 206 and 208 and above a semiconductor substrate or insulator 216, as illustrated.

The capacitance density achievable with the transcap technology may be increased at the expense of device performance. For example, with reference to FIG. 2, the capacitance density may be increased by reducing the distance between the non-insulative regions 218 and 220 for the RF+ and RF− terminals. However, reducing the distance between the non-insulative regions 218 and 220 may increase the parasitic capacitance associated with the structure, lowering the tuning range of the transcap device 200.

The capacitor-voltage (C-V) characteristic of the transcap device 100 determines its performance parameters, such as tuning range (Cmax/Cmin), max control voltage for achieving the full tuning range, Q, and linearity of the transcap device. However, these figures of merit may depend on several process parameters, such as well doping, oxide thickness, n+/p+ proximity to the Plate terminal, and Plate length. A tradeoff may exist between these performance parameters. For example, the tuning range of a transcap device may be increased either by increasing the plate length or by placing the n+ region far away from the plate terminal. However, in both cases, the device Q is degraded, and the tuning voltage used to improve tunability of the transcap device is increased. Similarly, the oxide thickness may be increased to improve the Q, but this choice may lead to a degradation of the tuning range. Likewise, higher well doping may provide better linearity and Q, but it may also degrade the device tuning range.

Figure 3:
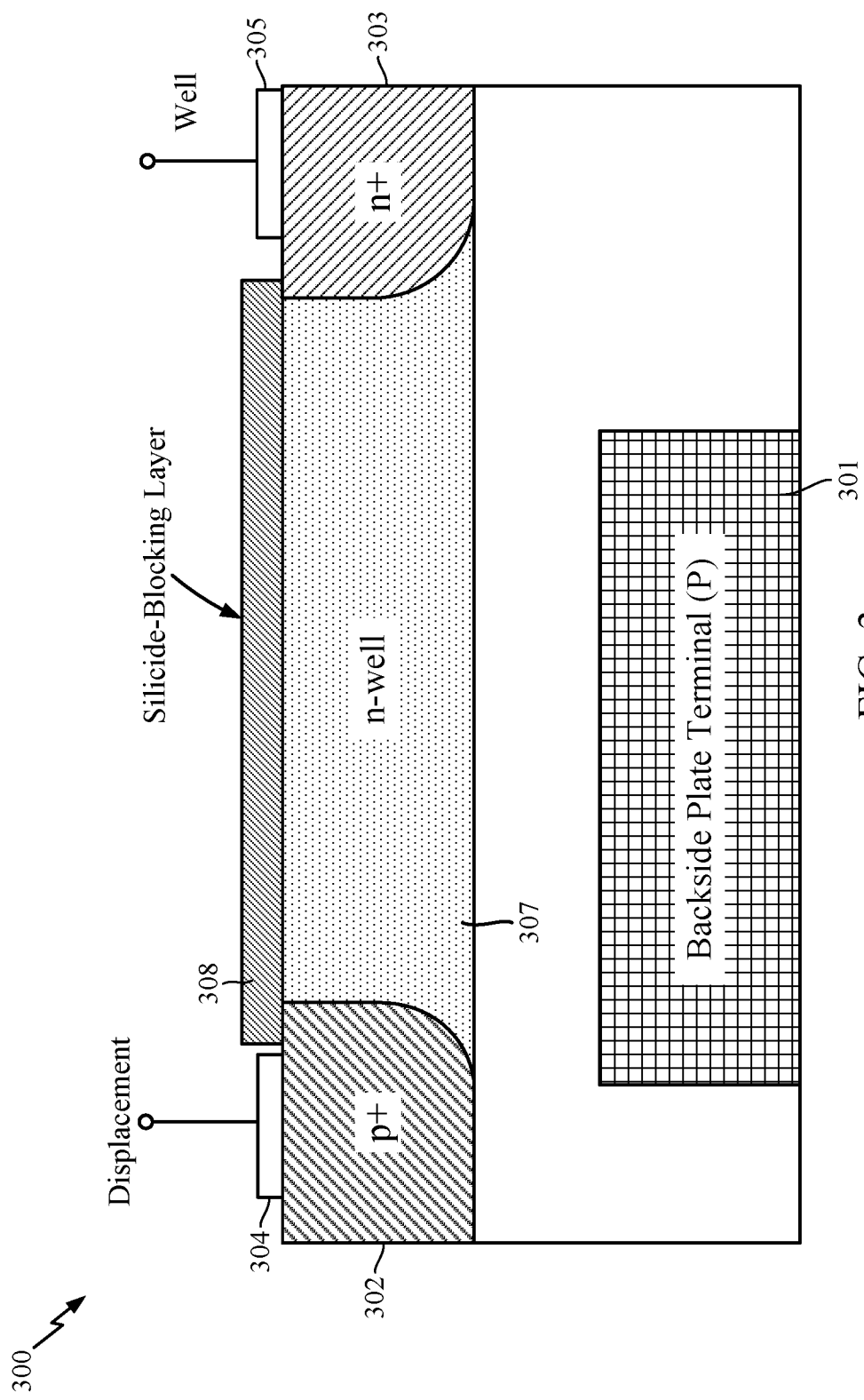
FIG. 3 illustrates an example buried oxide transcap device.

FIG. 3 illustrates an example buried oxide (BOX) transcap device 300. Transcap device 300 includes a non-insulative region 301, which may be a metal cavity, metal plate, etc. (e.g., copper). The non-insulative region 301 is used as or forms the P terminal of transcap device 300, which may function similar to the P terminal described with respect to FIG. 1. Transcap device 300 further includes non-insulative regions 302 and 303 and semiconductor region 307. Non-insulative region 302 is coupled to D terminal 304 (which may function similar to the D terminal described with respect to FIG. 1), and non-insulative region 303 is coupled to W terminal 305 (which may function similar to the W terminal described with respect to FIG. 1). Non-insulative regions 302 and 303 have different doping types; for example, as shown, non-insulative region 302 may be p-doped (e.g., heavily p-doped) and non-insulative region 303 may be n-doped (e.g., heavily n-doped). Semiconductor region 307 is disposed adjacent to each of and between non-insulative regions 302 and 303 and, for example, may be an n-well region. A capacitance between non-insulative region 301 and non-insulative region 303, or equivalently between the P and W terminals, may be adjusted by varying a control or bias voltage applied to non-insulative region 302 with respect to non-insulative region 301 or 303, similar to as described with respect to FIG. 1. Transcap device 300 further includes insulator region 306, which may be a BOX region (e.g., silicon dioxide, a BOX layer formed in a semiconductor substrate, etc.) and may serve as the plate oxide. In certain aspects, the insulator region 306 is disposed below the semiconductor region 307. Further, the non-insulative region 301 is disposed below the insulator region 306. The insulator region 306 is disposed between the semiconductor region 307 and the non-insulative region 301.

As compared to transcap devices such as device 100, BOX transcap device 300 may be capable of withstanding and operating at much higher voltages (e.g. up to 20V as opposed to, e.g., 2.5V to 3.3V for a device like transcap device 100). Device 300 may also have a higher device Q and linearity as opposed to a device like device 100. Accordingly, BOX transcap device 300 may be used in in applications where the voltage amplitude may reach high values, such as in RF front-end applications.

BOX transcap device 300 may also include a silicide-blocking layer 308. For example, silicide-blocking layer 308 may be a silicide block dielectric. Silicide-blocking layer 308 may prevent the formation of silicide on the upper surfaces of non-insulative regions 302 and 303 and semiconductor region 307. This may prevent shorting of device 300 (e.g., shorting of the p-n junction created the non-insulative regions 302 and 303 and semiconductor region 307) and allow for its proper operation. However, deposition of the silicide-blocking layer 308 on top of semiconductor region 307 can lead to the formation of interface charge traps at the interface between semiconductor region 307 and silicide-blocking layer 308, which may degrade the performance of device 300, since device 300 is sensitive to the quality of the oxide/silicon interface. Hence, it would be beneficial to have device structures that offer the benefits of BOX transcap device 300, including high operating voltage, higher device Q and linearity, while avoiding the performance degradation caused by interface charge traps. Aspects of the present disclosure present buried oxide transcap devices with reduced interface charge traps.

Figure 4A:
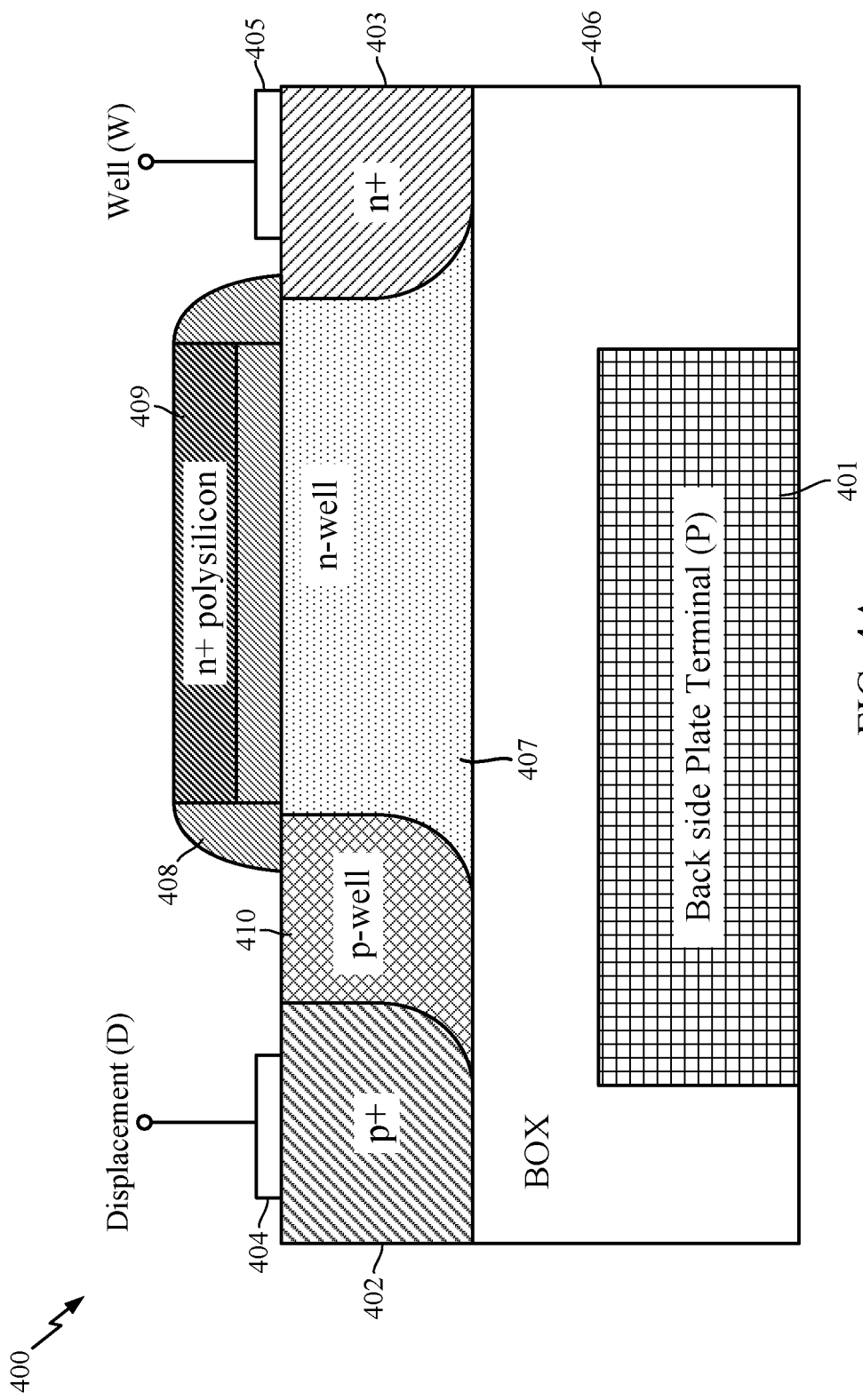
FIGS. 4A, 4B, and 4C illustrate buried oxide transcap devices in accordance with certain aspects of the present disclosure.
Figure 4B:
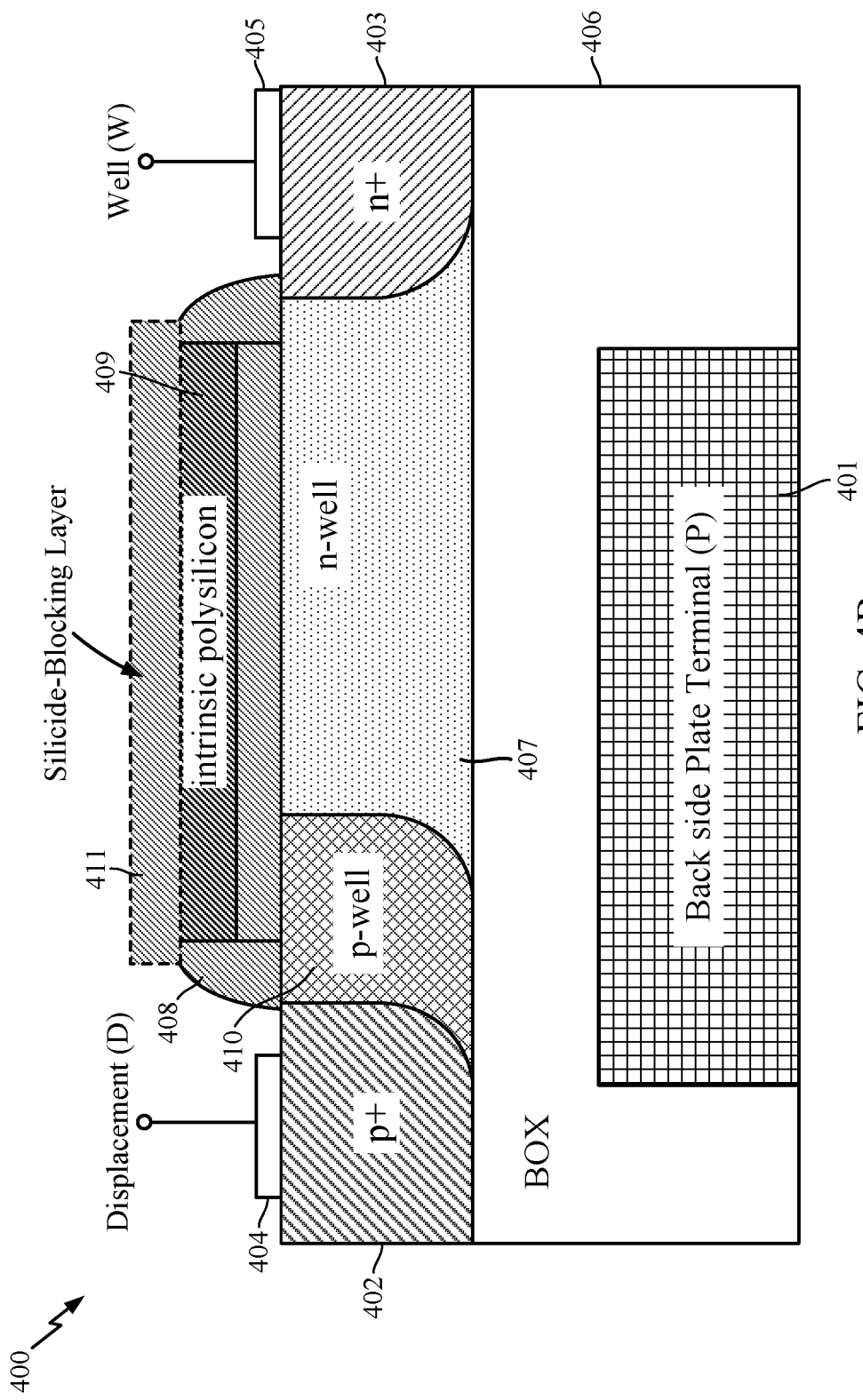
Figure 4C:
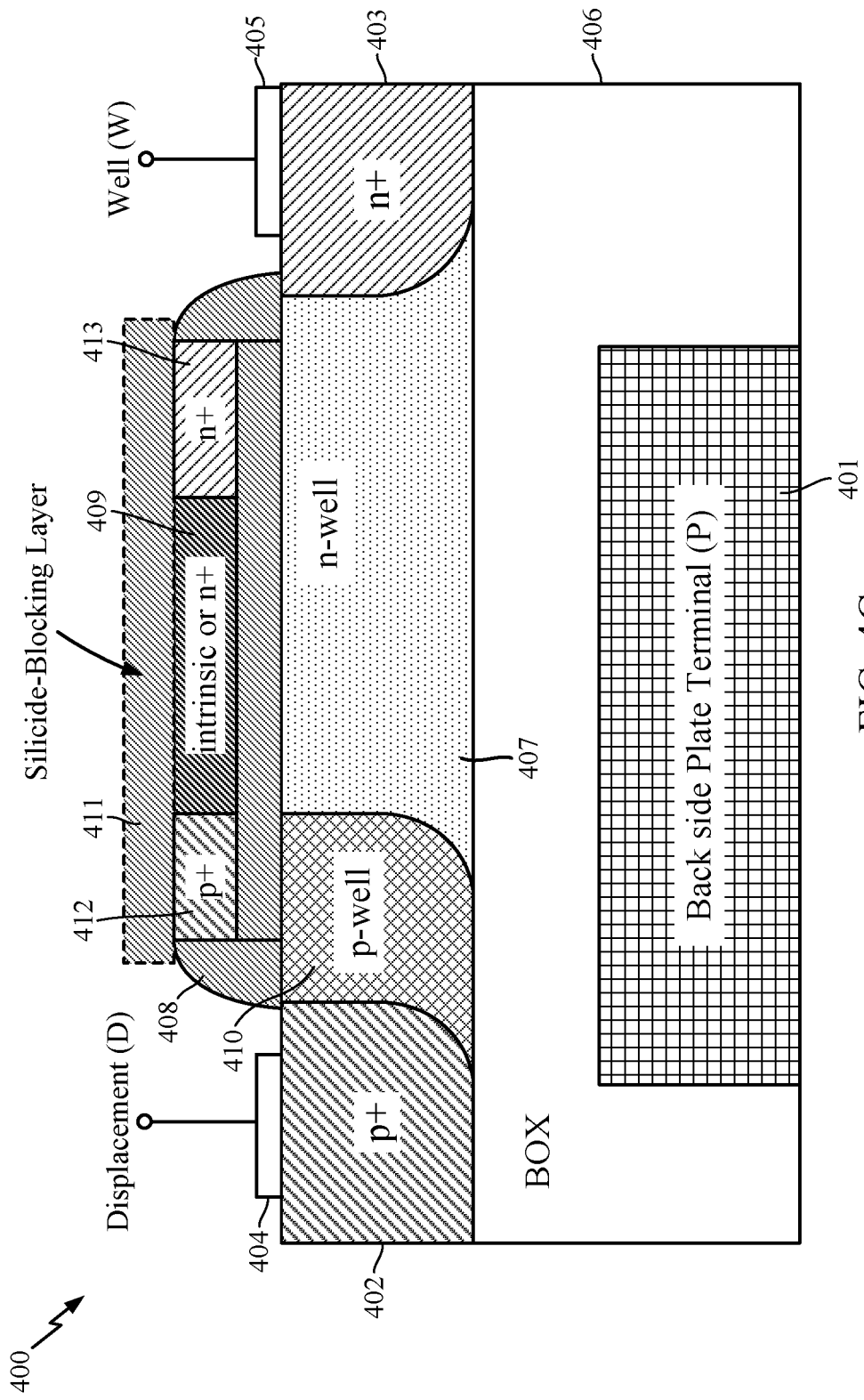

FIGS. 4A, 4B, and 4C illustrate example buried oxide transcap devices 400 in accordance with certain aspects of the present disclosure. Transcap device 400 may function similar to transcap device 300, but have reduced interface charge traps. Referring to FIG. 4A, transcap device 400 includes a non-insulative region 401, which may be a metal cavity, metal plate, etc. (e.g. copper). The non-insulative region 401 is used as or forms the P terminal of transcap device 400, which may function similar to the P terminal described with respect to FIG. 1. Transcap device 400 further includes non-insulative regions 402 and 403 and semiconductor region 407. Non-insulative region 402 is coupled to D terminal 404 (which may function similar to the D terminal described with respect to FIG. 1), and non-insulative region 403 is coupled to W terminal 405 (which may function similar to the P terminal described with respect to FIG. 1). Non-insulative regions 402 and 403 have different doping types; for example, as shown, non-insulative region 402 may be p-doped (e.g., heavily p-doped) and non-insulative regions 403 may be n-doped (e.g., heavily n-doped). Semiconductor region 407 is disposed adjacent to each of and between non-insulative regions 402 and 403 and, for example, may be an n-well region. According to some aspects, a capacitance between non-insulative region 401 and non-insulative region 403, or equivalently between the P and W terminals may be adjusted by varying a control or bias voltage applied to non-insulative region 402 with respect to non-insulative region 401 or 403, similar to as described with respect to FIG. 1. Transcap device 400 further includes insulator region 406, which may be a BOX region (e.g., silicon dioxide) and may serve as the plate oxide. In certain aspects, the insulator region 406 is disposed below the semiconductor region 407. Further, the non-insulative region 401 is disposed below the insulator region 406. The insulator region 406 is disposed between the semiconductor region 407 and the non-insulative region 401.

Unlike transcap device 300, transcap device 400 further includes insulator region 408, which may comprise a thermal oxide layer, which is disposed above semiconductor region 407 and semiconductor region 409, which may comprise a polysilicon layer (e.g., intrinsic polysilicon, doped partially n and partially p so as to minimize the overlap of n-doped regions with p-doped ones, or alternating p-doped and n-doped regions), which is disposed above insulator region 408. According to some aspects, transcap device 400 may also include p-well region 410 disposed between non-insulative region 402 (or non-insulative region 403) and semiconductor region 407.

In certain aspects, semiconductor region 409 is left floating or connected to the W terminal or another terminal (e.g., P or D) of the transcap device 400. By including an insulator region 408 (e.g., thermal oxide layer) above the semiconductor region 407, a good passivation of the non-silicided interface between semiconductor region 407 and insulator region 408 and may be achieved. Further, in certain aspects, the semiconductor region 409 (e.g., polysilicon layer), may act as a dielectric to avoid transcap device 400 performance degradation. For example, instead of a heavily n-doped or p-doped polysilicon layer that may lead to performance degradation, semiconductor region 409 may include an intrinsic polysilicon layer that behaves as a dielectric. In some aspects, semiconductor region 409 may include small doped portions (e.g., n and/or p doped) (e.g., in addition to the intrinsic polysilicon layer) such as shown and described with respect to FIG. 4C. For instance, as shown in FIG. 4C, semiconductor region 409 may include p-doped region 412 and n-doped region 413. In some aspects, semiconductor region 409 can be doped partially n and partially p so as to minimize the overlap of n-doped regions with p-doped ones or it can be obtained by alternating p doped and n-doped regions.

As shown in FIG. 4B, according to some aspects, device 400 may also include silicide-blocking layer 411, disposed above semiconductor region 409. Silicide-blocking layer 411 may, for instance, be a silicide-block dielectric. Such a silicide-blocking layer 411 may prevent the formation of silicide on the upper surfaces of semiconductor region 409.

In certain aspects, a buried oxide transcap device according to aspects described herein with respect to FIGS. 4A-4C may be manufactured using existing manufacturing processes, without requiring extensive modification to the manufacturing process. In addition, in certain aspects, a buried oxide transcap device according to aspects described herein with respect to FIGS. 4A-4C may be manufactured using high-K metal gate (HKMG) technology where high ohmic poly resistors are available. For example, in certain aspects, a buried oxide transcap device according to aspects described herein with respect to FIGS. 4A-4C may be manufactured using gate last process technologies with metal gate replacement by avoiding the poly silicon removal in the buried oxide transcap device.

Figure 5A:
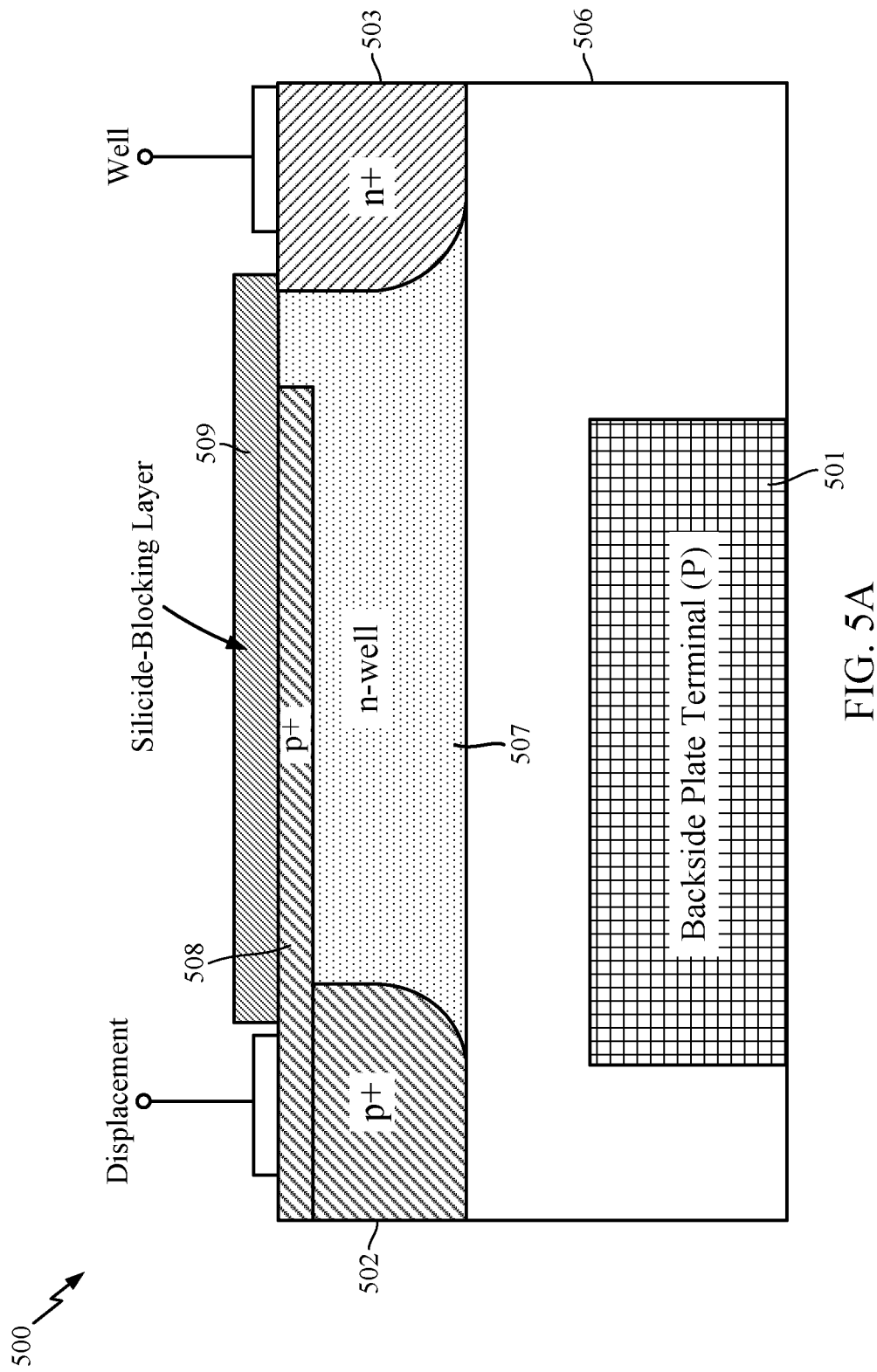
FIGS. 5A and 5B illustrate buried oxide devices in accordance with other aspects of the present disclosure.
Figure 5B:
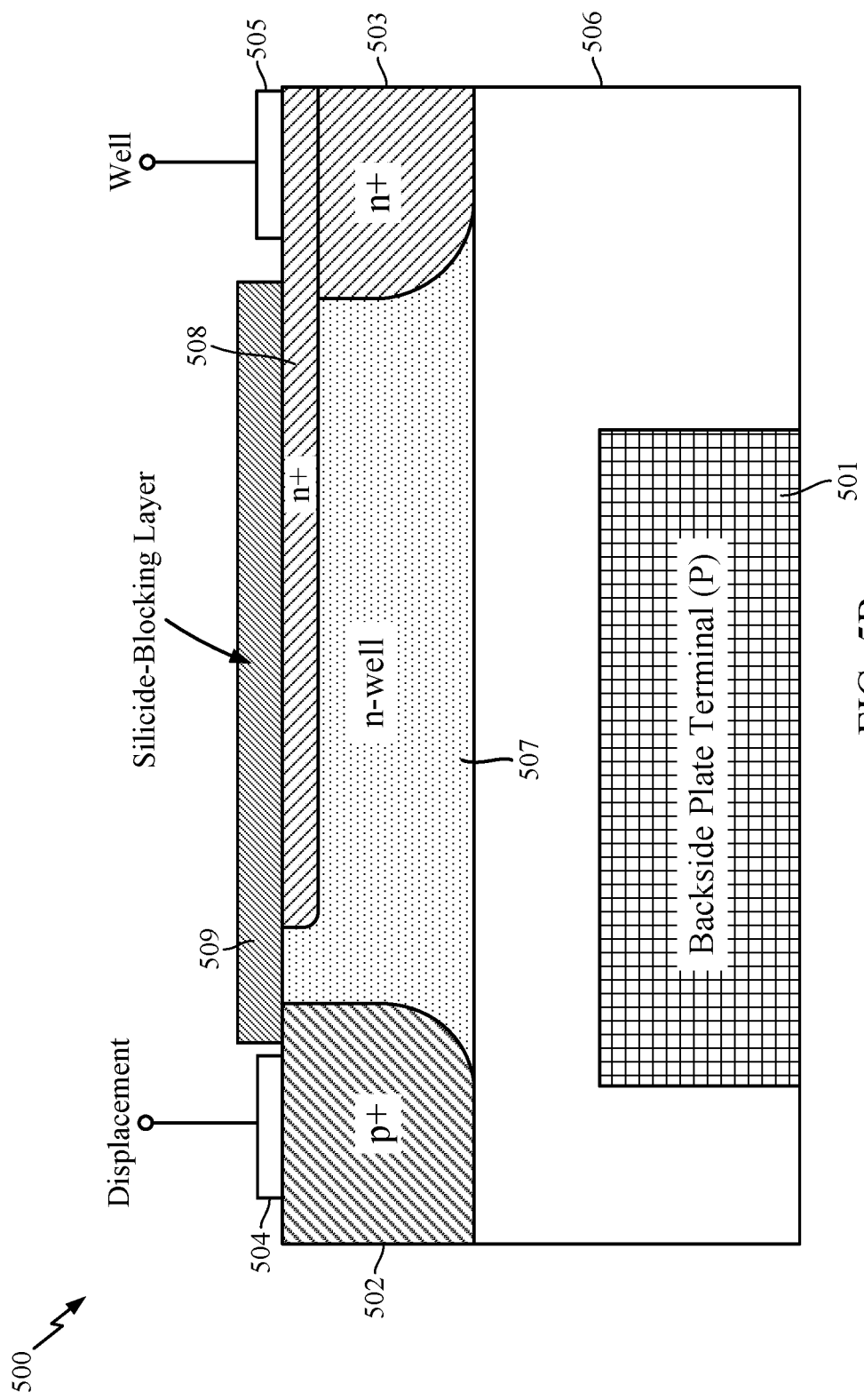

FIGS. 5A and 5B illustrate example buried oxide transcap devices 500 according to other aspects of the present disclosure. Transcap device 500 may function similar to transcap device 300, but have reduced interface charge traps. Transcap device 500 includes a non-insulative region 501, which may be a metal cavity, metal plate, etc. (e.g. copper). The non-insulative region 501 is used as or forms the P terminal of transcap device 500, which may function similar to the P terminal described with respect to FIG. 1. Transcap device 500 further includes non-insulative regions 502 and 503 and semiconductor region 507. Non-insulative region 502 is coupled to D terminal 504 (which may function similar to the D terminal described with respect to FIG. 1), and non-insulative region 503 is coupled to W terminal 505 (which may function similar to the P terminal described with respect to FIG. 1). Non-insulative regions 502 and 503 have different doping types; for example, as shown, non-insulative region 502 may be p-doped (e.g., heavily p-doped) and non-insulative region 503 may be n-doped (e.g., heavily n-doped). Semiconductor region 507 is disposed adjacent to each of and between non-insulative regions 502 and 503 and, for example, may be an n-well region. According to some aspects, a capacitance between non-insulative region 501 and non-insulative region 503, or equivalently between the P and W terminals, may be adjusted by varying a control or bias voltage applied to non-insulative region 502 with respect to non-insulative region 501 or 503, similar to as described with respect to FIG. 1. Transcap device 500 further includes insulator region 506, which may be a BOX region (e.g., silicon dioxide) and may serve as the plate oxide. In certain aspects, the insulator region 506 is disposed below the semiconductor region 507. Further, the non-insulative region 501 is disposed below the insulator region 506. The insulator region 506 is disposed between the semiconductor region 507 and the non-insulative region 501.

Unlike transcap device 300, transcap device 500 also includes a non-insulative region 508. Non-insulative region 508 is disposed above at least a portion of semiconductor region 507 and at least a portion of either non-insulative region 502 or non-insulative region 503. According to some aspects, non-insulative region 508 may be a shallow implant layer (e.g. with a depth of about 10 to 15 nm) and be disposed so that it has a top surface coplanar with a top surface of at least a portion of semiconductor region 507. According to other aspects, non-insulative region 508 may be a cap layer and be disposed above a top surface of semiconductor region 507. According to some aspects, device 500 may also include a silicide-blocking layer 509, which may be a silicide-block dielectric. In certain aspects, silicide-blocking layer 509 is disposed above at least a portion of non-insulative region 508 and above at least a portion of semiconductor region 507 (e.g., to prevent the formation of silicide on the upper surfaces of semiconductor region 507 and non-insulative region 508).

According to some aspects, non-insulative region 508 may have a same doping type as either non-insulative region 502 or non-insulative region 503, but a higher doping concentration. FIG. 5A illustrates a possible aspect where non-insulative region 502 is p-doped. Non-insulative region 508 is disposed above portions of both non-insulative region 502 and semiconductor region 507. Non-insulative region 508 is also p-doped but has a higher doping concentration than non-insulative region 502. FIG. 5B illustrates a possible aspect where non-insulative region 503 is n-doped. Non-insulative region 508 is disposed above portions of both non-insulative region 503 and semiconductor region 507. Non-insulative region 508 is also n-doped but has a higher doping concentration than non-insulative region 502.

Figure 6A:
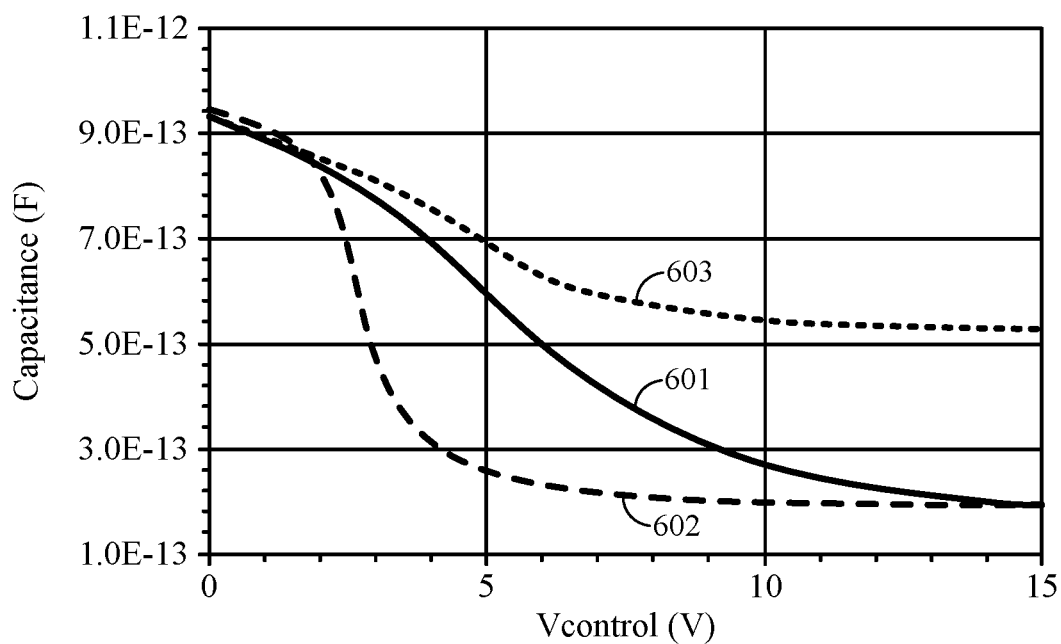
FIGS. 6A and 6B are graphs illustrating the capacitance and quality factor (Q) of buried oxide transcap device as a function of the control voltage for devices such as those illustrated in 5A and 5B.
Figure 6B:
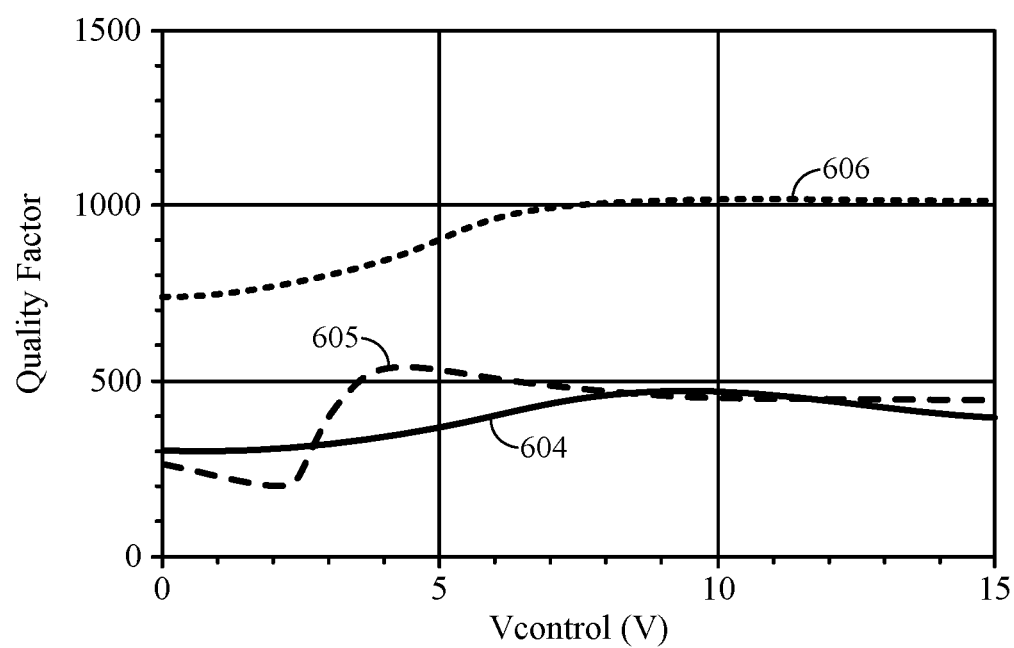

The presence of non-insulative region 508 in transcap device 500 may serve to screen the interaction of interface charge traps with the charges in semiconductor region 507. Thus, transcap device 500 may demonstrate improved or modified performance characteristics. FIGS. 6A and 6B show graphs of control voltage versus capacitance (FIG. 6A) and versus device Q (FIG. 6B) for example devices like device 500 in FIGS. 5A and 5B versus a conventional buried oxide transcap device such as device 300 in FIG. 3. Referring to FIG. 6A, curve 601 shows the control voltage on the x-axis versus capacitance on the y-axis for a device as in FIG. 3, curve 602 is for a device with a p-type shallow implant layer as in FIG. 5A, and curve 603 is for a device with an n-type shallow implant layer as in FIG. 5B. Referring to FIG. 6B, curve 604 shows control voltage on the x-axis versus Q on the y-axis for a device as in FIG. 3, curve 605 is for a device with a p-type shallow implant layer as in FIG. 5A, and curve 606 is for a device with an n-type shallow implant layer as in FIG. 5B. As shown by these figures, p-type devices such as those in FIG. 5A may be used to reduce the control voltage range required to adjust the capacitance of the device over its full tuning range. N-type devices such as those in FIG. 5B may reduce the tuning range as compared to a device like device 300 in FIG. 3, but may in turn show improved Q.

Figure 7A:
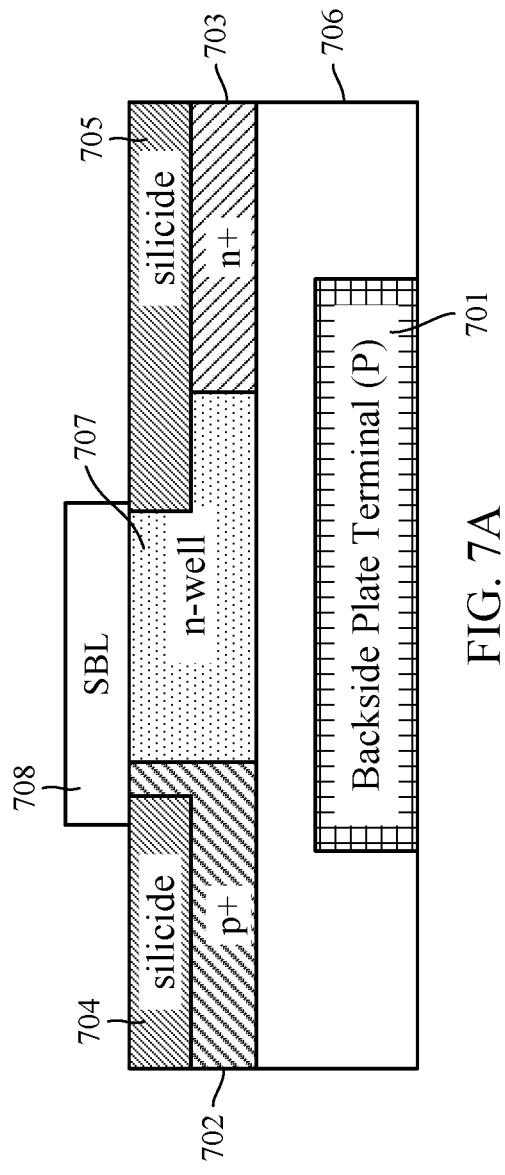
FIGS. 7A and 7B illustrate buried oxide devices in accordance with other aspects of the present disclosure.
Figure 7B:
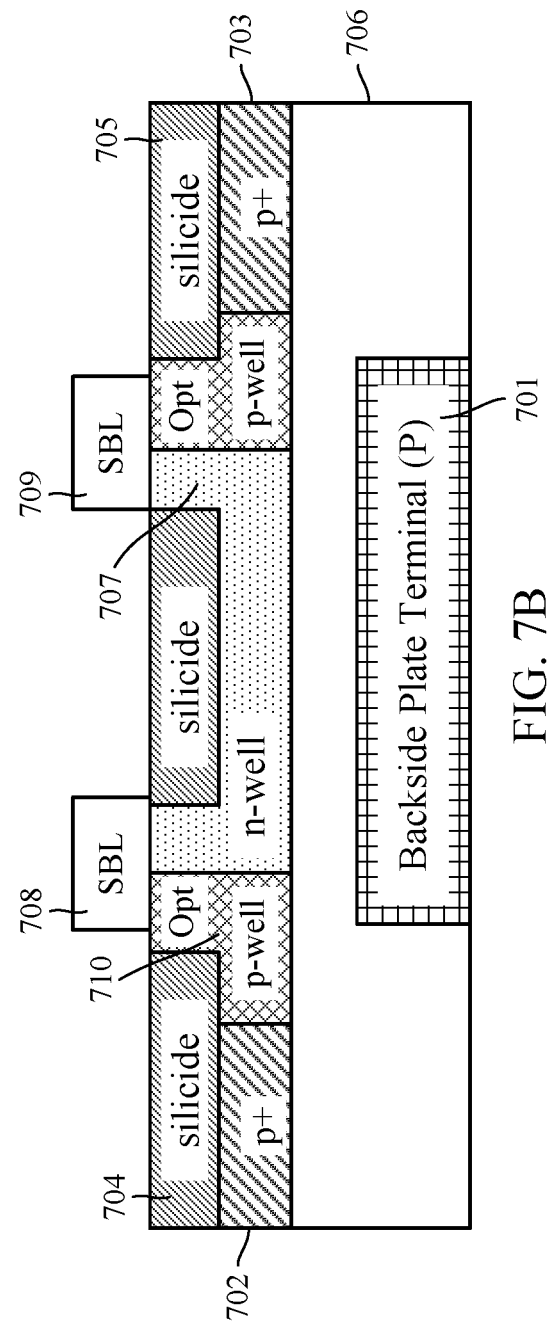

FIGS. 7A and 7B illustrate example buried oxide transcap devices 700 according to other aspects of the present disclosure. Transcap device 700 may function similar to transcap device 300, but have reduced interface charge traps. Transcap device 700 includes a non-insulative region 701, which may be a metal cavity, metal plate, etc. (e.g. copper). Non-insulative region 701 is used as or forms the P terminal of transcap device 700, which may function similar to the P terminal described with respect to FIG. 1. Transcap device 700 further includes non-insulative regions 702 and 703 and semiconductor region 707. Non-insulative regions 702 and 703 may have different doping types (e.g., heavily n-doped and heavily p-doped), as shown in FIG. 7A, or they may have the same doping type (e.g., heavily n-doped or heavily p-doped), as shown in FIG. 7B. Semiconductor region 707 is disposed adjacent to each of and between non-insulative regions 702 and 703 and, for example, may be an n-well region. Semiconductor region 707 is shaped such that at least one top length (e.g., of a top surface) of the semiconductor region 707 has a length less than a bottom length (e.g., of a bottom surface) of the semiconductor region 707. There may be one such top surface, as shown in FIG. 7A, which may be covered by a silicide-blocking layer 708 (e.g., to prevent formation of silicide on the upper surfaces of semiconductor region 707). There may also be more than one such top surface, as shown in FIG. 7B, in which case additional top surfaces may be covered by additional silicide-blocking layers such as silicide-blocking layer 709 (e.g., to prevent formation of silicide on the upper surfaces of semiconductor region 707). Silicide-blocking layers 708 and 709 may be, for instance, silicide-block dielectric. In certain aspects, silicide-blocking layers 708 and/or 709 are disposed above at least a portion of non-insulative region 508 and above at least a portion of one of non-insulative regions 702 and 703 and a portion of semiconductor region 708 (e.g., to prevent the formation of silicide on the upper surfaces of semiconductor region 708 and one of non-insulative regions 702 and 703).

Transcap device 700 may have non-insulative regions 704 and 705, which may comprise silicide and may act as D and W terminals (which may function similar to the D and W terminals described with respect to FIG. 1). Transcap device 700 may also include a shallow n-type implant (not shown) beneath non-insulative region 704 or non-insulative region 705, which may reduce the contact resistance of the terminal. According to some aspects, a capacitance between non-insulative region 701 and non-insulative region 703, or equivalently between the P and W terminals, may be adjusted by varying a control or bias voltage applied to non-insulative region 702 with respect to non-insulative region 701 or 703. Transcap device 700 further includes insulator region 706, which may be a BOX region (e.g., silicon dioxide) and may serve as the plate oxide. As shown in FIG. 7B, device 700 may also include at least one P-well region 710, which is disposed between semiconductor region 707 and either non-insulative region 702 or non-insulative region 703. In certain aspects, the insulator region 706 is disposed below the semiconductor region 707. Further, the non-insulative region 701 is disposed below the insulator region 706. The insulator region 706 is disposed between the semiconductor region 707 and the non-insulative region 701.

In certain aspects, a buried oxide transcap device according to aspects described herein with respect to FIGS. 7A-7B may be manufactured using existing manufacturing processes, without requiring extensive modification to the manufacturing process. For instance, such as compared to a reference design such as transcap device 300, transcap device 700 may be obtained by simply modifying the silicide-blocking mask.

Figure 8A:
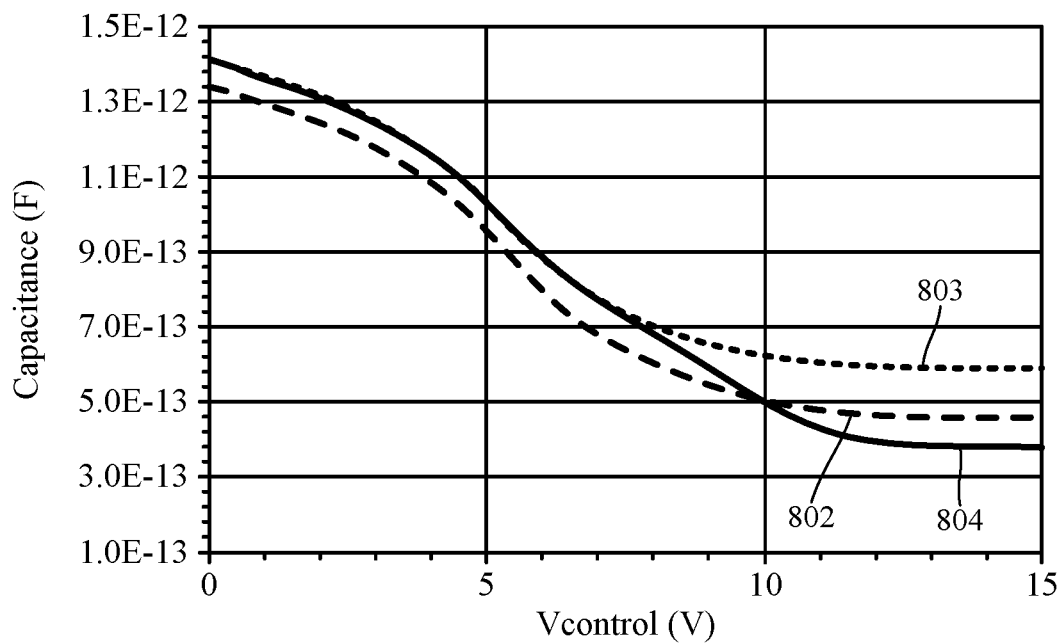
FIGS. 8A and 8B are graphs illustrating the capacitance and quality factor (Q) of buried oxide transcap device as a function of the control voltage for devices such as those illustrated in 7A and 7B.
Figure 8B:
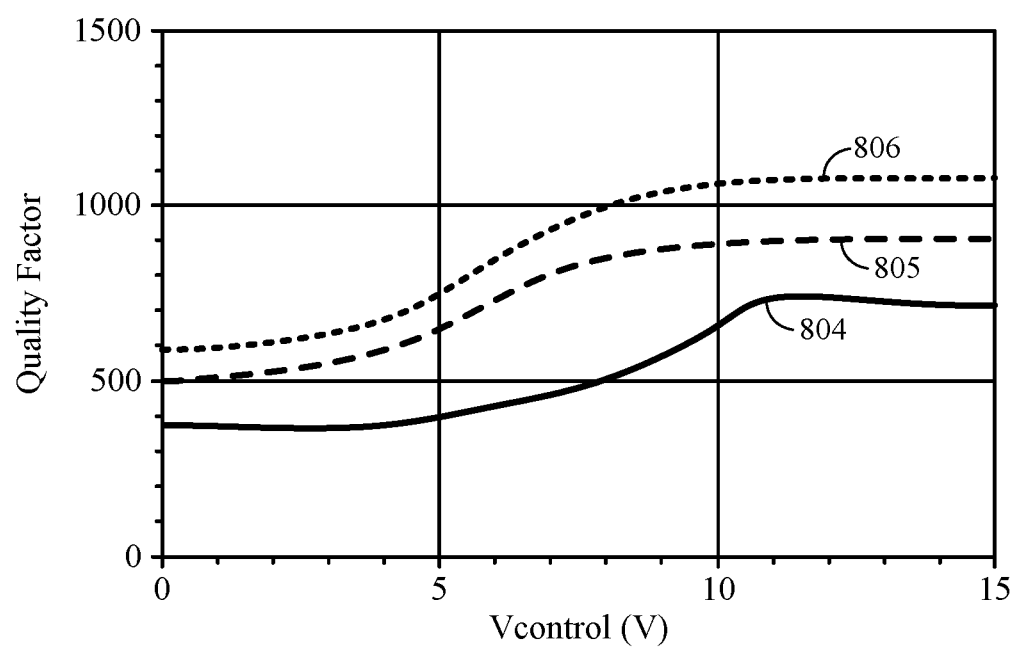

By reducing the length of the interface between semiconductor region 707 and silicide-blocking layers 708 and 709 (such as compared to transcap device 300), interactions between the interface charge traps and the charge in semiconductor region 707 may be reduced. Thus, performance degradation caused by interface charge traps may be reduced. Thus, transcap device 700 may demonstrate increased device performance characteristics. FIGS. 8A and 8B show graphs of control voltage versus capacitance (FIG. 8A) and versus device Q (FIG. 8B) for example devices like device 700 in FIGS. 7A and 7B versus a conventional buried oxide transcap device such as device 300 in FIG. 3. Referring to FIG. 8A, curve 801 shows the control voltage on the x-axis versus capacitance on the y-axis for a device as in FIG. 3, curve 802 is for a device as in FIG. 7A, and curve 803 is for a device as in FIG. 7B. Referring to FIG. 8B, curve 804 shows control voltage on the x-axis versus Q on the y-axis for a device as in FIG. 3, curve 805 is for a device as in FIG. 8A, and curve 806 is for a device as in FIG. 8B. As shown by these figures, while the tuning range for example devices 700 may be reduced as compared to example device 300, devices 700 may demonstrate significantly increased Q. Hence, device 700 may offer ways to optimize device performance by minimizing linearity degradation.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor variable capacitor comprising:
   a first semiconductor region;
   a first insulator region disposed below the first semiconductor region;
   a first non-insulative region disposed below the first insulator region;
   a second non-insulative region disposed adjacent to the first semiconductor region;
   a third non-insulative region disposed adjacent to the first semiconductor region, wherein the first semiconductor region is disposed between the second non-insulative region and the third non-insulative region, the second and third non-insulative regions having different doping types;
   a second insulator region disposed above the first semiconductor region; and
   a second semiconductor region disposed above the second insulator region, wherein at least a first portion of the second semiconductor region comprises doped polysilicon and at least a second portion of the second semiconductor region comprises intrinsic polysilicon.

2. The semiconductor variable capacitor of claim 1, wherein a capacitance between the first non-insulative region and the second non-insulative region is configured to be adjusted by varying a control voltage applied to the third non-insulative region with respect to the first non-insulative region or the second non-insulative region.

3. The semiconductor variable capacitor of claim 1, wherein the first insulator region comprises at least a portion of a buried oxide (BOX) region disposed between the first semiconductor region and the first non-insulative region.

4. The semiconductor variable capacitor of claim 1, further comprising:
   a silicide-blocking layer disposed above the second semiconductor region.

5. The semiconductor variable capacitor of claim 1, further comprising:
   a p-well region disposed between either the second non-insulative region or the third non-insulative region and the first semiconductor region.

* * * * *